United States Patent [19]

Wersing et al.

[11] Patent Number: 5,045,746

[45] Date of Patent: Sep. 3, 1991

[54] ULTRASOUND ARRAY HAVING TRAPEZOIDAL OSCILLATOR ELEMENTS AND A METHOD AND APPARATUS FOR THE MANUFACTURE THEREOF

[75] Inventors: Wolfram Wersing, Kirchheim; Karl Lubitz, Ottobrunn; Reinhard Lerch, Heroldsberg; Hans Kaarmann, Buckenhof; Martina Vogt, Fuerth, all of Fed. Rep. of Germany

[73] Assignee: Siemens Aktiengesellschaft, Munich, Fed. Rep. of Germany

[21] Appl. No.: 484,352

[22] Filed: Feb. 22, 1990

[30] Foreign Application Priority Data

Feb. 22, 1989 [EP] European Pat. Off. ........ 89103112.2

[51] Int. Cl.⁵ ........................ H01L 41/08

[52] U.S. Cl. ........................ 310/334; 310/322; 310/326; 310/367

[58] Field of Search ............... 310/334, 322, 323, 326, 310/335, 336, 337, 345, 348, 367

[56] References Cited

U.S. PATENT DOCUMENTS

| | | | |
|---|---|---|---|
| 2,716,708 | 8/1955 | Bradfield | 310/334 |
| 2,833,999 | 5/1958 | Howry | 310/335 |
| 3,059,130 | 9/1958 | Robins | 29/25.35 |
| 4,211,948 | 7/1980 | Smith et al. | 310/322 |
| 4,211,949 | 7/1980 | Brisken et al. | 310/334 |
| 4,305,014 | 12/1981 | Borburgh et al. | 310/334 |
| 4,604,542 | 8/1986 | Thompson | 310/323 |
| 4,825,116 | 4/1989 | Itoh et al. | 310/335 |

FOREIGN PATENT DOCUMENTS

| | | | |
|---|---|---|---|
| 3739226 | 1/1989 | Fed. Rep. of Germany . | |
| 57-58498 | 7/1982 | Japan . | |
| 0113700 | 7/1982 | Japan | 310/334 |
| 0148247 | 9/1982 | Japan | 29/25.35 |
| 57-113700 | 10/1982 | Japan . | |
| 595154 | 12/1947 | United Kingdom . | |

*Primary Examiner*—Mark O. Budd
*Assistant Examiner*—Thomas M. Dougherty
*Attorney, Agent, or Firm*—Hill, Van Santen, Steadman & Simpson

[57] ABSTRACT

An ultrasound array has a number of oscillator elements arranged side-by-side, each oscillator element having a trapezoidal cross-section. The oscillator elements are separated from each other by incisions having non-parallel walls, which are co-planar with surfaces of the piezoelectric material comprising the oscillator element. The incisions terminate in a damping member, to which all of the oscillator elements are attached. The incisions are produced with an excimer laser whose laser beam is focused onto a prepared layered material, with the incisions proceeding along a line.

10 Claims, 3 Drawing Sheets

ULTRASOUND ARRAY HAVING TRAPEZOIDAL OSCILLATOR ELEMENTS AND A METHOD AND APPARATUS FOR THE MANUFACTURE THEREOF

BACKGROUND OF THE INVENTION

1. Field of the Invention

The present invention is directed to an ultrasound array consisting of a plurality of oscillator elements disposed side-by-side, and to a method and apparatus for manufacturing such an array.

2. Description of the Prior Art

German OS 28 29 570 discloses in FIG. 5 an ultrasound array consisting of a plurality of oscillator elements side-by-side, each oscillator element having opposite faces coated with electrode material, thereby forming first and second electrode surfaces. The second electrode surface of each oscillator element is disposed in a base region connecting all of the oscillator elements. The side faces of the oscillator elements, extending between the first and second electrode surfaces, proceed non-parallel to each other so that each oscillator element has a trapezoidal (wedge like) cross-section. The oscillator elements are attached to a common damping member. Two types of oscillator elements are used in alternation. In one type of oscillator elements, the trapezoidal cross-section is oriented so that the widest portion is closest to the damping member, with the oscillator element tapering to a narrowest width as the distance from the damping member increases. In the other type of oscillator element, the narrowest portion is closest to the damping member, and the element widens with increasing distance from the damping member.

It is also known from German OS 28 29 570 that an ultrasound array having a fine division of the individual transducer elements can be manufactured by a sawing technique, for example using a laser cutting beam.

Such an ultrasound array is not suitable for use as a phased array applicator because the two types of oscillator elements disposed side-by-side have different emission characteristics. The width of the emission face of each oscillator surface must be smaller than or equal to $\lambda/2$, whereby $\lambda$ is the wavelength of the emitted ultrasound in the propagation medium. This condition cannot be met, or can be only unsatisfactorily met, in an ultrasound array having two different types of oscillator elements.

SUMMARY OF THE INVENTION

It is an object of the present invention to provide an ultrasound array constructed of a plurality of individual identical oscillator elements which enables short ultrasound pulses having a mean frequency in the range of 1–50 MHz to be generated with a high bandwidth.

In the array disclosed herein, the oscillator elements, which consist of a piezoelectric ceramic material coated on opposite sides with electrode material, operate as thickness mode oscillators. The oscillator elements should each have an optimally large aperture angle so that the ultrasound array can be used as a linear phased array for scanning acoustically transparent subjects using ultrasound pulses, preferably for the ultrasound examination of patients for medical purposes. The individual oscillator elements should have high transmission and reception transfer factors.

It is a further object of the present invention to provide an ultrasound array as described above which can be used as a phased array antenna for scanning acoustically transparent subjects.

It is a further object of the present invention to specify a method for manfacturing such an array and an apparatus for undertaking manufacture of the array.

The object of using the array as a phased array is achieved in accordance with the principles of the present invention in an array consisting of plurality of oscillator elements arranged so that their respective cross-sections change in identical fashion in the direction from the first to the second electrode surfaces.

Oscillator elements which are identical and which have non-parallel boundary surfaces are thus used. All of the oscillator elements thus have the same directional characteristic, and given a suitably selected dimensioning, all have aperture angle of a suitable size.

In a preferred embodiment of the invention, the first electrode surface, facing toward the emission face of the oscillator element is smaller than the second electrode surface, facing toward the damping member.

The method for manufacturing such an ultrasound array in accordance with the principles of the present invention begins with irradiation of a piezoelectric material with a laser cutting beam along parallel, spaced lines. The piezoelectric ceramic material is irradiated from only one side with laser radiation which converges so that incisions having non-parallel walls are generated side-by-side in the ceramic material.

An apparatus for implementing the method includes a laser whose laser beam can be directed onto the piezoelectric material. A focusing means is disposed between the piezoelectric material and the laser, so that the laser beam converges as it penetrates the piezoelectric material.

DESCRIPTION OF THE PREFERRED EMBODIMENTS

Heretofore, oscillator elements having identical cuboid geometry were primarily used as the oscillator elements in phase-controlled ultrasound antennas (phased arrays). The parallel geometrically limiting surfaces of such oscillator elements have the disadvantage of causing highly defined and extremely pronounced resonances in the transverse oscillation modes. The resonant locations of such transducer or oscillator elements derive directly from the sound propagation speed and from the geometrical length or width according to the following equation:

$$f_{res} = \frac{c}{2w}(2n+1)$$

wherein n=0, 1, 2, 3,. . . and $f_{res}$ is the resonant frequency of the oscillator elements, c is the sound propagation speed, and w is the width (or length) of the oscillator.

These pronounced resonances are desirable in the thickness direction z. In the transverse direction (x and/or y), however, such modes have a parasitic character. They therefore deform the ultrasound field and reduce the efficiency of the array. The suppression of such parasitic oscillatory modes is therefore necessary.

Figure 1:
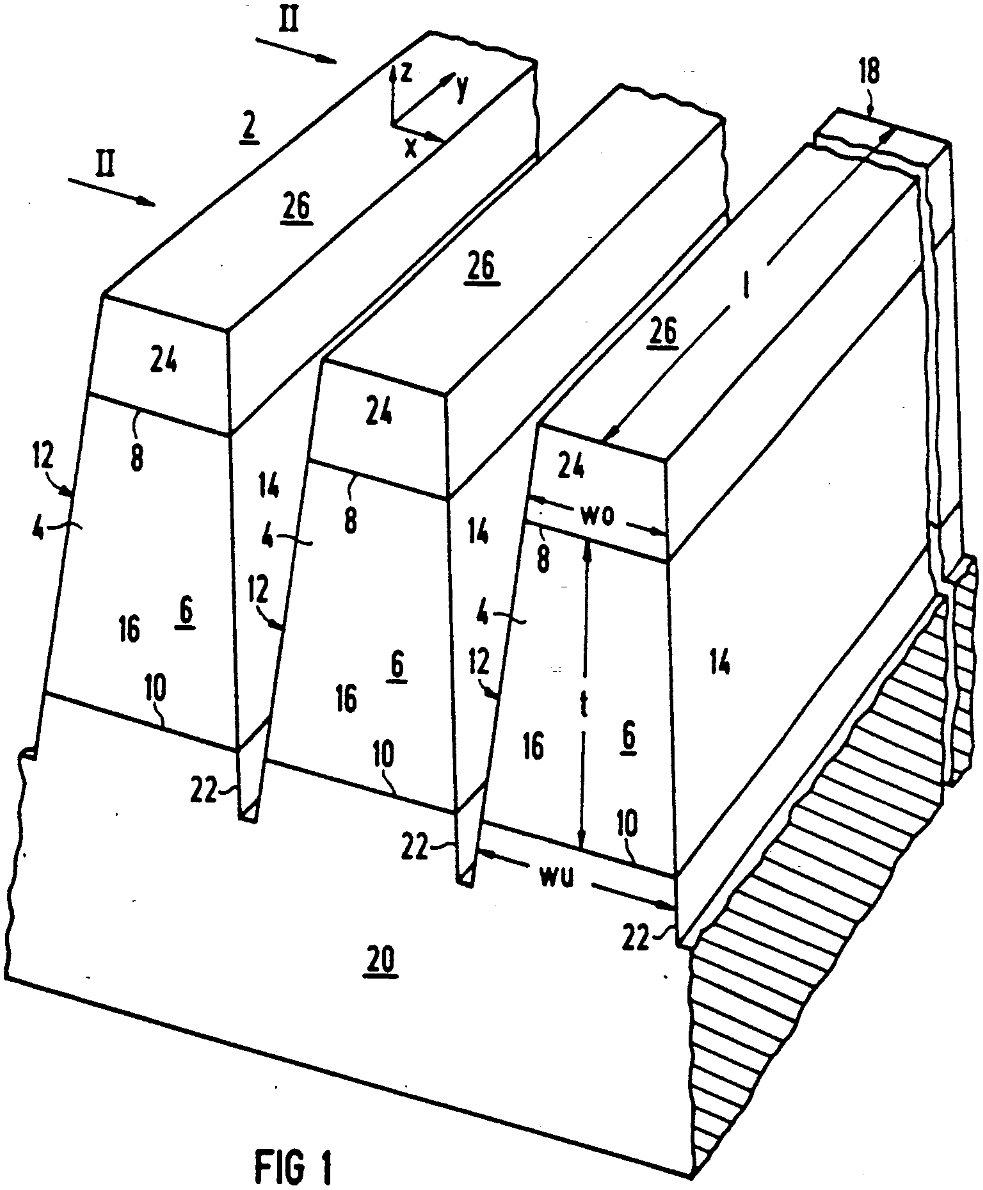
FIG. 1 is a perspective view, partly broken away of a portion of an ultrasound oscillator array constructed in accordance with the principles of the present invention.

An ultrasound array 2 constructed in accordance with the principles of the present invention, which is suitable for use as a phased array for medical purposes, is shown in FIG. 1. The array 2 consists of a plurality of oscillator elements 4 disposed side-by-side in the longitudinal direction of the array. Each oscillator element 4 has a core 6 consisting of piezoelectric material, preferably a piezoceramic such as, for example, PZT-5. Each oscillator element 4 also has first and second electrode surfaces disposed at opposite, parallel faces, and coated with electrode material 8 and 10. The non-cuboid oscillator elements 4 are all identical, and are aligned so that their cross-section continuously changes in the same manner in a direction proceeding from the first electrode surface 8 to the second electrode surface 10. In the embodiment of FIG. 1, as is preferred, the first electrode surface 8 is smaller than the second electrode surface 10.

All of the oscillator elements have the second electrode surface 10 disposed in a base area. To avoid defined transverse resonances, the oscillator elements 4 have non-parallel first and second boundary surfaces 12 and 14 disposed opposite each other in the transverse direction x. Third and fourth boundary surfaces 16 and 18, in the longitudinal direction y, are also preferably not parallel to each other. The result is that the aforementioned resonant condition is not met for the directions x and y.

An oscillator element 4 having a trapezoidal cross-section as shown in FIG. 1 is, for example, suitable for this purpose. The lateral boundaries of the trapezoid can be envisioned as being approximated by a step function for illustrative purposes. The above resonant condition is valid for each of these steps. The blurring of a defined transverse resonance, which would appear given parallel walls, is thus achieved by the trapezoidal oscillator cross-section in a frequency band which is established between $f_{resu}$ and $f_{reso}$, defined as follows:

$$f_{resu} = \frac{c}{2w_u}(2n+1) \text{ with } n = 1, 2, 3, 4, \ldots \text{ and}$$

$$f_{reso} = \frac{c}{2w_o}(2n+1) \text{ with } n = 0, 1, 2, 3, \ldots, \text{ whereby}$$

$w_u$ is the length of the lower trapezoid edge and $w_o$ is the length of the upper trapezoid edge.

As noted above, the longitudinal section of the oscillator elements may also be trapezoidal, or the longitudinal section may be trapezoidal instead of the transverse section.

The parasitic oscillatory modes are suppressed by oscillator element geometries having non-parallel boundary surfaces 12 and 14 and/or 16 and 18, whereas the useful mode (thickness mode) is boosted.

The individual oscillator elements 4 are situated on a common damping member 20, whose surface represents the base area in which the second electrode surfaces 10 of the oscillator elements 4 are arranged. As is known, the damping member 20 may consist of a particle-filled plastic which is based, for example, on epoxy or polyurethane. The individual oscillator elements 4, having substantially smooth boundary surfaces 12 and 14, are separated from each other by V-shaped gaps or incisions 22. The V-shaped incisions 22 in the embodiment of FIG. 1 each extend into the damping member 20. Each oscillator element 4 has an emission side provided with a coupling layer 24. It is important that a common coupling layer, covering all of the oscillator elements 4, not be used. Instead, the individual, discrete coupling layers 24 are separated from each other by the gap 22. This insures a good acoustic decoupling among the oscillator elements. The incision 22, which is shared by all of the layers 24, 8, 6, 10 and 20, is generated in one cycle during the manufacture of the array 2. The ultrasound emission face at each coupling layer 24 is referenced 26.

It has been shown that a wedge angle of 2° through 3° for the incision 22 is sufficient for preventing transverse modes. This wedge angle is defined by the non-parallel boundary surfaces 12 and 14.

In the embodiment of FIG. 1, the first electrode surface 8 facing toward the emission face of the oscillator element 4 is smaller than the effective, second electrode surface 10 facing toward the damping layer 20.

In a manufactured embodiment, the wedge angle was 2.5°" the thickness t of the individual oscillator elements 4 was t=0.4 mm, the length was l=12 mm, and width was $w_u$=0.2 mm. It should be noted that the thickness t of the piezoelectric material and the width $w_u$ are dependent on the medium in which the ultrasound propagates after coupling. The width $w_u$ should be less than or equal to λ/2, whereby λ is the wavelength of the ultrasound wave in the propagation medium. The thickness t and the width $w_u$ preferably differ by a factor of two or more. In the manufactured embodiment, a factor of exactly two was selected.

Figure 2:
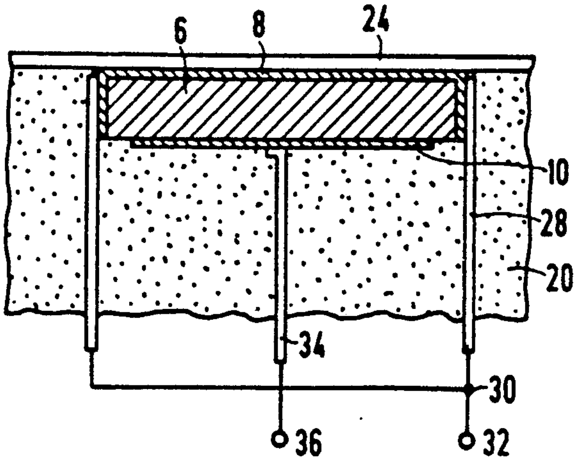
FIG. 2 is a central section in the longitudinal direction of an oscillator element of the array of FIG. 1 for illustrating the electrode connections.

In the side view shown in FIG. 2, it can be seen that the first electrode 8 at the emission side is laterally angled over both edges of the oscillator, with the angled edges being electrically connected via a ground line 28 to a common point 30, for example, to a grounded terminal 32. The second electrode 10 has a center tap which is connected to a further terminal 36 via a line 34.

Figure 3:
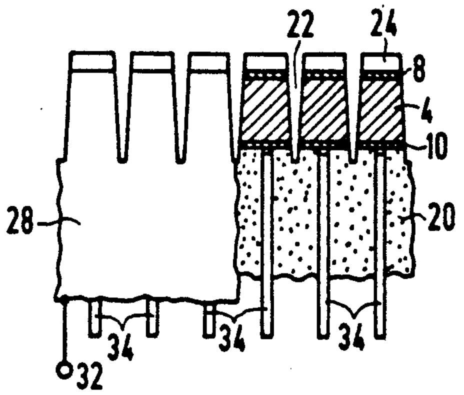
FIG. 3 is a side view, partly in section, of a number of the oscillator elements of the array of FIG. 1 for illustrating the electrode connections.

It can also be seen in FIG. 3 that a plurality of downwardly conducting lines 34 laterally project from the ultrasound array 2.

Oscillator elements such as the oscillator elements 4, having non-parallel boundary surfaces 12 and 14 and/or 16 and 18, can be manufactured only with great difficulty using standard processing methods, such as mechanical sawing or separation grinding. This problem is resolved in accordance with the principles of the present invention by employing laser sawing technology. Different types of lasers are available for this purpose such as, for example, argon ion and Nd-YAG lasers. It is necessary, however, that the energy for the cutting is supplied to the prepared layer packet 40 (consisting of the layers 24, 8, 6, 10 and 20 with the piezoceramic core 6) in extremely short, high-energy pulses, so that no greater heating of the material arises in the environment of the cut edge or groove than is necessary to create the cut. Such excessive heating would produce a high lead depletion in the piezoceramic core 6, so that the core 6 would become inactive in the region of the cut, for example, in the region of the incision 22.

Because the piezoceramic core 6 is fundamentally transparent for the light of the aforementioned lasers, the absorption of the laser emission ensues only on the basis of non-linear effects. The result in that the cut surfaces do not become very smooth, and beads arise at the edges 22.

Figure 4:
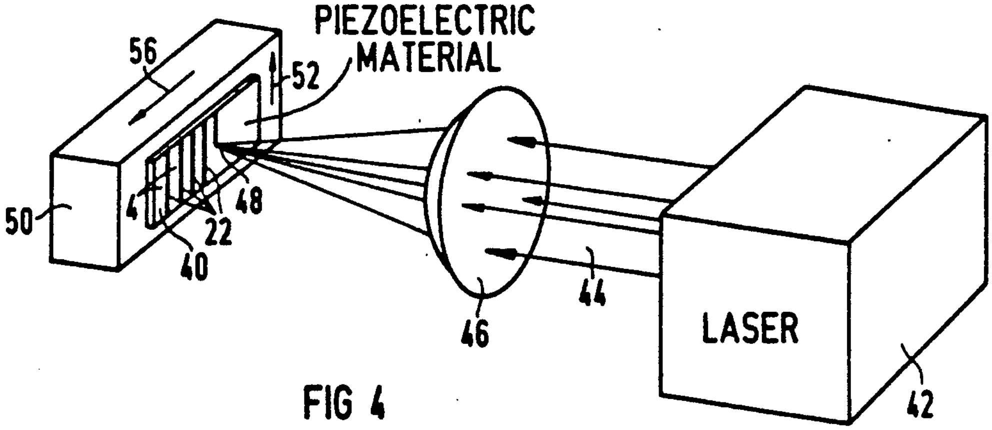
FIG. 4 is a schematic representation of a first embodiment of an apparatus and method for manufacturing the array of FIG. 1.
Figure 5:
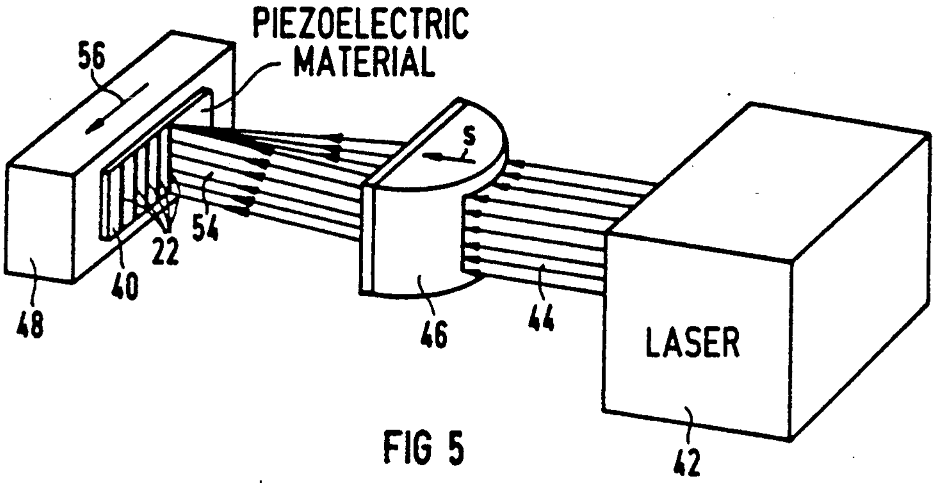
FIG. 5 is a schematic view of a second embodiment of an apparatus and method for manufacturing the array of FIG. 1.
Figure 6:
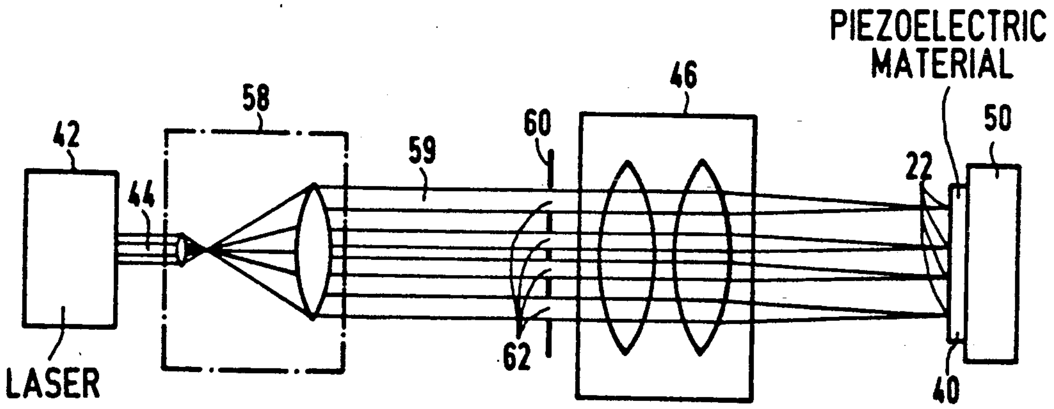
FIG. 6 is a schematic diagram of a third embodiment of an apparatus and method for manufacturing the array of FIG. 1.

These problems are solved in an apparatus and which are shown in three embodiments in FIGS. 4, 5, and 6 wherein an excimer laser 42 is used to avoid overheating and to achieve smooth surfaces. The light of such a laser is in the ultraviolet range and is directly absorbed by the piezoceramic core 6 in the packet 40.

In the embodiment shown in FIG. 4, a ray 44 from the laser 42 is focused with a focusing element 46 so that a point focus 48 is obtained, i.e., with a collecting lens, and is directed onto the location of the piezoceramic 6 in the packet 40 which is to be eroded. The desired V-shape of the incisions 22 and thus the trapezoidal shape of the oscillator elements 4, can be selected with the focusing element 46. The incisions 22 arise from a relative motion between the piezoelectric ceramic core 6 and the laser light having the point focus 48 during irradiation. Preferably only the layer packet 40 is moved for producing the incisions 22. To that end, the layer packet 40 is mounted on a holder 50 which is moved in the direction of the arrow 52.

The apparatus shown in the embodiment of FIG. 5 is similar to that of the embodiment of FIG. 4, however, the focusing means 46 in the embodiment in FIG. 5 is a cylinder lens which converges to a line focus 54 having a length which is the desired length of the incision 22. The relative motion which is necessary in the embodiment of FIG. 4 can be avoided in the embodiment of FIG. 5 by using the line focus 54 for producing the incisions 22.

The spacing of the incisions 22, i.e., the width w of the oscillator elements 4, is set in the embodiments of FIGS. 4 and 5 by a relative stepped transverse movement between the packet 40 and the laser light, such as by an appropriate mechanical (step-by-step) feed of the packet 40 transversely relative to the main radiation direction s of the laser beam. To that end, the packet 40 is moved step-by-step in the direction of arrow 56 with the holder 50.

A further manufacturing embodiment is shown in FIG. 6. In this embodiment, the radiation 44 emerging from the laser 42 is spread by a beam expander 58, so that the expanded laser beam 59 would cover the entire array surface. The expanded laser beam 59 then passes through a mask 60 which is provided with slots 62. The arrangement of the slots 52 represents an image of the incisions 22 lying side-by-side on the ceramic core 6. The mask 60 is imaged onto the surface of the layer package 40 by the focusing means 46, which now constitutes an imaging system, so that a plurality of line foci identical in number to the number of desired incisions 22 are simultaneously generated from the expanded laser beam 59. The apparatus of FIG. 6 thus permits the manufacture of all parallel spaced incisions 22 in the ultrasound array 2 in one work cycle.

In the methods used by the various embodiments of FIGS. 4, 5 and 6 the depth of the cut of the incision 22 is set by the number of laser pulses. This can thus be controlled with extremely high reproduction precision.

Although modifications and changes may be suggested by those skilled in the art, it is intention of the inventors to embody within the patent warranted hereon all changes and modifications as reasonably and properly come within the scope of their contribution to the art.

We claim as our invention:

1. An ultrasound array comprising:

a plurality of identical separated side-by-side oscillator elements each having a core of piezoelectric material and first and second spaced trapezoidal electrode surfaces at opposite sides of the core coated with electrode material, said first electrode surface facing an emission direction of the array and, said second electrode surface being disposed at a base region of the array, said first electrode surface being smaller in area in a plane substantially normal to said emission direction than said second electrode surface, and each oscillator element further having first and second non-parallel boundary surfaces extending between said first and second electrode surfaces so that each oscillator element has a cross-section which changes identically in a direction from said second electrode surface to said first electrode surface.

2. An ultrasound array as claimed in claim 1, wherein each oscillator element further has third and fourth boundary surfaces extending between said first and second electrode surfaces and between said first and second boundary surfaces, said third and fourth boundary surfaces being non-parallel relative to each other.

3. An ultrasound array as claimed in claim 2, wherein said third and fourth boundary surfaces are substantially planar.

4. An ultrasound array as claimed in claim 2, wherein said third and fourth boundary surfaces are trapezoidal.

5. An ultrasound array as claimed in claim 1, wherein said first and second boundary surfaces are substantially planar.

6. An ultrasound array as claimed in claim 1, further comprising a common damping member to which all of said oscillator elements are attached at said base region of the array with oscillator elements next to each other on the common damping member being separated by a V-shaped incision.

7. An ultrasound array as claimed in claim 1, wherein each oscillator element further has a coupling layer disposed on and covering said first electrode surface, said coupling layer having an outer surface spaced from said first electrode surface and sides extending between said outer surface and said first electrode surface, said sides of said coupling layer respectively being disposed in planes containing said first and second boundary surfaces.

8. An ultrasound array comprising:

a carrier;

a plurality of identical side-by-side oscillator elements disposed on said carrier, each oscillator element having first and second spaced trapezoidal electrode surfaces coated with electrode material, said first surface facing an emission direction of the oscillator elements and said second electrode surface being adjacent said carrier, said first surface being smaller in area in a plane substantially normal to said emission direction and each oscillator element further having first and second substantially planar, non-parallel boundary surfaces extending between said first and second electrode surfaces so that each oscillator element has a trapezoidal cross-section between said first and second boundary surfaces; and said carrier having a plurality of parallel V-shaped incisions, each incision having spaced walls and said oscillator elements being disposed between said incisions with the walls of said incision being substantially co-planar with the respective boundary surfaces of the oscillator elements.

9. An ultrasound array as claimed in claim 8, wherein each oscillator element further has third and fourth non-parallel boundary surfaces extending between said first and second electrode surfaces and between said first and second boundary surfaces so that each oscillator element has a trapezoidal cross-section between said third and fourth boundary surfaces.

10. An ultrasound array as claimed in claim 9, wherein each oscillator element has a coupling layer disposed on and covering said first electrode surface, said coupling layer having an outer surface spaced from said first electrode surface and four sides extending between said outer surface and said first electrode surface, said four sides being respectively co-planar with said first, second, third and fourth boundary surfaces.

* * * * *